(12) United States Patent
Lavaud et al.

(10) Patent No.: US 11,594,735 B2
(45) Date of Patent: Feb. 28, 2023

(54) METAL FOIL FOR ELECTROCHEMICAL ELEMENT ELECTRODE COMPRISING A MATERIAL, BASED ON TI, C AND H

(71) Applicant: H.E.F., Andrezieux-Boutheon (FR)

(72) Inventors: Celine Lavaud, Bordeaux (FR); Cecile Tessier, Bruges (FR); Laurent Dubost, Chamboeuf (FR); Michel Joseph Pierre Marie Martin, Septeme (FR)

(73) Assignee: H.E.F., Andrézieux-Bouthéon (FR)

( * ) Notice: Subject to any disclaimer, the term of this patent is extended or adjusted under 35 U.S.C. 154(b) by 140 days.

(21) Appl. No.: 16/796,287

(22) Filed: Feb. 20, 2020

(65) Prior Publication Data
US 2020/0274168 A1   Aug. 27, 2020

(30) Foreign Application Priority Data
Feb. 21, 2019   (FR) ...................................... 1901747

(51) Int. Cl.
*H01M 4/66* (2006.01)
*H01M 4/90* (2006.01)
*H01M 10/0525* (2010.01)
*H01M 10/0562* (2010.01)
*H01M 10/0566* (2010.01)
(Continued)

(52) U.S. Cl.
CPC ........... *H01M 4/661* (2013.01); *H01M 4/663* (2013.01); *H01M 4/666* (2013.01); *H01M 4/667* (2013.01); *H01M 4/9041* (2013.01); *H01M 10/0525* (2013.01); *H01M 10/0562* (2013.01); *H01M 10/0566* (2013.01); *H01M 10/3909* (2013.01); *H01M 2004/8694* (2013.01)

(58) Field of Classification Search
CPC .............................. H01M 4/663; H01M 4/667
See application file for complete search history.

(56) References Cited

U.S. PATENT DOCUMENTS

| 2001/0024598 | A1 | 9/2001 | Schier |
| 2008/0254332 | A1* | 10/2008 | Eun ..................... H01M 8/0284 |
| | | | 429/437 |
| 2014/0329070 | A1 | 11/2014 | Draxler et al. |

(Continued)

FOREIGN PATENT DOCUMENTS

| CN | 107419220 A | 12/2017 |
| DE | 100 11 918 A1 | 9/2001 |
| EP | 2 680 286 A1 | 1/2014 |

OTHER PUBLICATIONS

French Preliminary Search Report for 1901747 dated Nov. 21, 2019.
Written Opinion for 1901747 dated Nov. 21, 2019.

*Primary Examiner* — Stephan J Essex
(74) *Attorney, Agent, or Firm* — Sughrue Mion, PLLC (57) ABSTRACT

A metal foil including on at least one of its sides a layer of a material including: a metal or a metal alloy, carbon, hydrogen, and optionally oxygen, the atomic percentage of the metal or of the metals of the alloy in the material ranging from 10 to 60%, the atomic percentage of carbon in the material ranging from 35 to 70%, the atomic percentage of hydrogen in the material ranging from 2 to 20%, and the atomic percentage of oxygen if present in the material being less than or equal to 10%. The metal foil can be used in the manufacture of a cathode of a lithium-ion electrochemical cell. The deposition of this layer reduces the internal resistance of the cell.

5 Claims, 6 Drawing Sheets (51) Int. Cl.
*H01M 10/39* (2006.01)
*H01M 4/86* (2006.01)

(56) References Cited

U.S. PATENT DOCUMENTS

2015/0001519 A1  1/2015  Matsuura et al.
2018/0298483 A1* 10/2018  Vieluf ................ C23C 14/0635

* cited by examiner

METAL FOIL FOR ELECTROCHEMICAL ELEMENT ELECTRODE COMPRISING A MATERIAL, BASED ON TI, C AND H

TECHNICAL FIELD

The technical field of the invention is that of current collectors, especially those intended for use in the positive electrode (or cathode) of an electrochemical cell, preferably of the lithium-ion type.

PRIOR ART

The term "cell", as used hereinbelow, refers to an electrochemical cell. The terms "cell" and "electrochemical cell" are used interchangeably in the present description.

An electrochemical cell generally comprises an electrochemical assembly comprising alternating cathodes and anodes surrounding an electrolyte-impregnated separator. Each electrode consists of a metallic current collector supporting on at least one of its sides a film of active material comprising at least one active material and generally a binder and an electronically conductive compound.

The cathode of a Li-ion type cell consists of a cathodic active material composition coated on a current collector, generally consisting of aluminum or an aluminum-based alloy. This aluminum foil oxidizes slightly in contact with air and therefore has a layer of alumina $Al_2O_3$ on its surface. In the cell, in contact with the electrolyte and the salt in this electrolyte, the alumina layer will fluorinate and transform into $AlF_3$. This new $AlF_3$ layer is electrically insulating. It therefore tends to impede the passage of electrons by increasing the contact resistance between the cathodic active material composition and the aluminum foil. It can be observed that a Li-ion cell with a cathode whose current collector is made of aluminum will have its internal resistance increase over time as the current collector comes into contact with the electrolyte. The increase in internal resistance results, on the one hand, in a decrease in the electrical performance of the cell when it is used in charge or discharge at a high current (or regime) and, on the other hand, in higher heating during cycling.

In order to reduce the loss of electrical conductivity between the active material composition and the aluminum current collector, a layer can be deposited on the surface of the current collector. This layer can be based on carbon or on a metal carbide, such as tungsten carbide. In this regard, US 2011/0200884 describes a process for reducing the contact resistance between an aluminum foil and an active material composition deposited on the surface of the foil. This process, which is carried out under vacuum, comprises a step of partially etching the alumina oxide layer on the surface of the aluminum foil followed by a step of sputtering a metal or a metal carbide on the partially etched surface of the foil, typically tungsten (W) or tungsten carbide (WC).

The disadvantage of this prior art is that the use of tungsten or its carbide poses many problems. For example, tungsten is a rather rare cell, the manufacture of a sputtering target in WC is expensive and its implementation is tricky. In addition, compressive stresses are high in thin layers containing tungsten due to the high mass of W atoms. This is detrimental to the aging and processing of foils coated with this material. For these reasons, novel ways are being sought to reduce the contact resistance between an aluminum foil and an active material composition deposited on the surface of that foil.

SUMMARY OF THE INVENTION

For this purpose, the invention provides a metal foil comprising on at least one of its sides a layer of a material comprising:
a metal or a metal alloy,
carbon,
hydrogen,
and optionally oxygen,
the atomic percentage of the metal or of the metals of the alloy in the material ranging from 10 to 60%,
the atomic percentage of carbon in the material ranging from 35 to 70%,
the atomic percentage of hydrogen in the material ranging from 2 to 20%,
the atomic percentage of oxygen if present in the material being less than or equal to 10%.

According to an embodiment, the material also comprises nitrogen.

According to an embodiment, the atomic percentage of the metal or of the metals of the alloy in the material ranges from 30 to 50%, preferably from 40 to 50%.

According to an embodiment, the atomic percentage of carbon in the material ranges from 40 to 60%, preferably from 45 to 55%.

According to an embodiment, the atomic percentage of hydrogen in the material ranges from 3 to 15%, preferably 3 to 8%.

According to an embodiment, the material comprises oxygen, and the atomic percentage of oxygen in the material is less than or equal to 5%, preferably less than or equal to 2%, and more preferably less than or equal to 1%.

According to an embodiment,
the atomic percentage of the metal or of the metals of the alloy in the material ranges from 40 to 50%,
the atomic percentage of carbon in the material ranges from 40 to 55%,
the atomic percentage of hydrogen in the material ranges from 3 to 8%, and
the atomic percentage of oxygen in the material is less than or equal to 5%.

According to an embodiment, the metal of the material is selected from Ti, Cr, Zr, Fe, Ni, preferably Ti.

According to an embodiment, the alloy of the material is composed of several metals selected from Ti, Zr, Fe, Cr and Ni.

According to an embodiment, the layer thickness ranges from 30 to 200 nm or from 50 to 150 nm or from 50 to 100 nm.

According to an embodiment, the metal foil is made of aluminum or of aluminum-based alloy, or of copper or of copper-based alloy.

The invention also relates to a cathode of an electrochemical cell comprising a foil as described above.

The conductive layer deposited on the foil is stable over time in the organic electrolyte of a Li-ion cell. The presence of this conductive layer improves the contact between the cathodic active material and the foil, which results in:
lower internal resistance of the cell,
better discharge capacity of the cell,
lower polarization of the cell.

Due to the lower internal resistance of the cell, the cell heats up less when used in cycling with few or no rest phases. In addition, the presence of the conductive layer on the foil protects its surface against alkaline corrosion in the aqueous process.

The invention also relates to an electrochemical cell comprising a cathode and an anode, the cathode or the anode comprising a metal foil as described above.

According to an embodiment, the electrochemical cell is selected from:
- a lithium primary electrochemical cell, for example of the $LiCF_x$ type,
- a liquid-electrolyte lithium-ion type secondary electrochemical cell,
- a solid-electrolyte lithium-ion type secondary electrochemical cell,
- a sodium-ion type primary or secondary electrochemical cell,
- a lithium-sulfur type secondary electrochemical cell, and
- a sodium-sulfur type electrochemical cell.

The invention also relates to a fuel cell comprising at least one bipolar plate comprising at least one metal foil as described above, wherein the metal foil comprises gas distribution channels on at least one side comprising said layer.

The invention also relates to a process for manufacturing a layer of a material comprising a metal or a metal alloy, carbon and hydrogen on a metal foil, said method comprising the steps of:
a) provision of a substrate consisting of a metal foil,
b) etching of one side of the substrate by bombardment of ions resulting from the ionization of an inert gas,
c) sputter deposition on the etched side of the substrate of a material comprising:
  a metal or a metal alloy,
  carbon,
  hydrogen,
and optionally oxygen,
the sputtering being carried out with a target consisting of said metal or said metal alloy in a mixture of an inert gas and a hydrocarbon gas at a temperature of 25° C., this mixture optionally containing nitrogen.

According to an embodiment, the metal of the material of step c) is titanium.

According to an embodiment, the process consists only in steps a) to c).

According to an embodiment, the process does not include an annealing step of the metal foil coated with the material obtained at the end of step c)

According to an embodiment, the hydrocarbon is acetylene.

Finally, the invention relates to a metal foil obtained by the process described above.

DESCRIPTION OF THE EMBODIMENTS a) Manufacture of the Foil:

The process according to the invention makes it possible to obtain a layer of the material on a metal foil. It comprises:
a) a step of vacuum etching of the foil surface and then
b) step of vacuum deposition of the material by sputtering. Steps a) and b) are carried out in a spray chamber. This chamber comprises a target, a support for receiving the foil acting as a substrate, and is provided with an inlet port for the injection of a gas.

The target consists of the metal or of the metal alloy which is one of the constituents of the layer material. The metal can be selected from Ti, Cr, Zr, Fe and Ni, preferably Ti. The metals of the alloy are at least two metals preferably selected from Ti, Cr, Zr, Fe and Ni. In one embodiment, the metal is neither Fe nor Ni and the metal alloy does not comprise Fe and/or does not comprise Ni.

The substrate consists of the metal foil. The metal of the foil is preferably aluminum or an aluminum-based alloy. It can also be copper or a copper-based alloy. The thickness of the foil is generally less than or equal to 50 µm. The minimum foil thickness is usually 5 µm. The thickness may be greater than or equal to 10 µm, greater than or equal to 15 µm or greater than or equal to 20 µm. Generally, the foil has a thickness ranging from 5 µm to 35 µm.

The step a) of etching the substrate consists of polarizing the substrate and bombarding its surface with ions from an ionized inert gas (plasma). The bombardment reduces or even eliminates the oxide layer on the surface of the foil. The etching step improves the adhesion of the layer to the metal foil.

The step b) of sputtering is characterized in particular by injecting into the chamber a mixture of an inert gas and a gaseous hydrocarbon at a temperature of 20-30° C. By way of example, the hydrocarbon may be selected from the group consisting of methane, ethylene, propane, acetylene or a mixture of several of these gases. Acetylene is preferred because of its low H/C ratio. Preferably, the inert gas is argon. The chamber is first evacuated and then the inert gas-hydrocarbon mixture is injected. The injection rate of the mixture can be modified as well as its composition. A potential difference is applied between the target and the walls of the chamber. This potential difference causes the mixture of inert gas and hydrocarbon to ionize. A plasma forms. Positively charged plasma species are attracted to the target and collide with the metal or the metal alloy. This collision causes the atoms of the metal or of the metal alloy of the target to be sputtered. These atoms condense on the surface of the foil. The accumulation of atoms on the surface of the foil allows the progressive formation of a thin layer of a material comprising the metal or the metal alloy, carbon, hydrogen and optionally oxygen. In a search for layer homogeneity, the foil can be rotated in front of the target during sputtering. Optionally, nitrogen can be injected into the chamber during the sputtering step, in addition to hydrocarbon gas. The injection of nitrogen gas allows the chemical element nitrogen to be incorporated into the material layer.

The substrate can be biased at a potential ranging from −100 to −500 V, preferably from −150 and −450 V, or even from −200 to −400 V. The substrate can be biased in a pulse mode at a frequency ranging from 150 to 350 kHz, or from 200 to 300 kHz, for example about 250 kHz. The substrate can be biased to a potential of −200 to −500 V. The hydrocarbon flow rate depends on the characteristics of the enclosure used (size, pumping). The flow rate can vary from 2 to 50 sccm, or from 2 to 25 sccm, or from 5 to 20 sccm (1 sccm=1 cm$^3$/min, under standard pressure and temperature conditions). The argon flow rate can be about 30 sccm. Layer growth rates between 1 and 15 nm/min, or from 2 to 10 nm/min, or from 4 to 10 nm/min can be achieved.

The person skilled in the art knows how to vary the flow rate of the mixture of the inert gas and the hydrocarbon gas as a function of the features of the spray chamber, such as the target size, the sputtering power, or even the pumping rate in order to obtain a material whose atomic percentages of metal or metals in the alloy, of carbon, hydrogen and oxygen fall within the specified limits, namely 10 to 60%, 35 to 70%, 2 to 20%, and at most 10%, respectively.

At the end of the deposition, the foil is removed from the chamber. Analysis of the nature of the chemical elements present in the layer can be carried out by X-ray fluorescence on the surface of the foil or by inductively coupled plasma spectroscopy (ICP) or Rutherford backscatter spectroscopy (RBS). The precise hydrogen content in the material can be measured using the elastic recoil detection analysis (ERDA) technique. The precise metal content, especially titanium, can be measured by the Rutherford backscattering spectrometry (RBS) technique. Precise oxygen and carbon contents can be measured by nuclear reaction analysis (NRA). The nitrogen content optionally present in the material can be accurately measured by RBS.

The layer material may include chemical elements other than the metal or those contained in the alloy, carbon, hydrogen and optionally oxygen and nitrogen. These other chemical cells are generally present in an amount of 2% or less of the atomic amount of the chemical elements constituting the material, preferably in an amount of 1% or less.

The thickness of the layer generally ranges from 25 to 200 nm, or from 30 to 150 nm, or from 40 to 150 nm, or from 50 to 150 nm, or from 50 to 100 nm. The layer thickness can be measured, for example, on a glass indicator by partially masking the substrate and then measuring the step height with an AlphaStep model profilometer manufactured by Tencor Instruments.

The electrical resistivity p of the layer (in micro Ohmx-meter [μΩ×m]) can range from 0.5 to 14 μΩ·m, or from 1 to 10 μΩ·m, or from 2 to 10 μΩ·m, or from 1 to 5 μΩ·m. The resistivity of the layer can be evaluated on an electrically insulating indicator, for example a very thin glass slide, by measuring the surface resistance R☐, called R "square", in Ohm [Ω], with a Lucas Labs S-302-6 4-point measuring instrument and then multiplying R☐ by the thickness of the layer (in m). The dispersion of the measurements is of the order of 5 to 10% for resistivity values between 2 μΩ·m and 30 μΩ·m.

b) Manufacture of the Cathode:

The following description is made with reference to the cathode of a liquid-electrolyte lithium-ion type secondary cell. But it is understood that the invention is not limited to the manufacture of a cathode of a liquid-electrolyte lithium-ion type secondary cell. It can be applied to the manufacture of a negative electrode (anode). It can be applied to the manufacture of an electrode for an electrochemical cell other than a liquid-electrolyte lithium-ion secondary cell. The invention may, for example, be applied in the production of current collectors intended to be used in the manufacture of the following cells:

a primary lithium cell, for example of the LiCF$_x$ type,
a solid-electrolyte lithium-ion type secondary cell,
a liquid- or solid-electrolyte sodium-ion type primary or secondary cell,
a lithium-sulfur type secondary cell, and
a sodium-sulfur type cell.

The invention can be applied to the production of current collectors intended to be used in a supercapacitor electrode or in a fuel cell electrode. The invention can also be applied to the production of gas distribution plates of a fuel cell, also named bipolar plates.

The side or sides of the foil coated with the layer of material obtained by the process according to the invention is or are coated with a cathodic active material composition. The cathodic active material composition comprises at least one cathodic active material, usually at least one binder and at least one good electron conducting compound. The cathodic active material composition is obtainable by a wet process, i.e. by a process comprising the addition of an aqueous or organic solvent to the active material composition. The cathodic active material composition can also be obtained by a dry process, i.e. without solvent incorporation.

Typically, for the wet process, the cathodic active material, binder, electron-conducting compound and solvent are mixed. The active material composition is deposited by coating on the metal foil serving as a current collector. An electrode that is dried to evaporate the solvent is thus obtained.

The positive active material composition can also be obtained by a dry process without the use of solvents by mixing the active material, binder and good electron conducting compound in an extruder.

The electrode obtained by a dry or wet process is then subjected to a calendering step in which the thickness of the layer of deposited active material composition is adjusted. The layer of active material composition deposited has a thickness after calendering generally between 25 μm and 300 μm. The amount of dry active material composition deposited on the current collector generally ranges from 5 mg/cm$^2$/side to 50 mg/cm$^2$/side, making the generator suitable for high-power or high-energy applications.

The cathodic active material of the cell is not particularly limited. It can be selected from the group consisting of:

a compound i) of formula $Li_xMn_{1-y-z}M'_yM''_zPO_4$ (LMP), where M' and M'' are different from each other and are selected from the group consisting of B, Mg, Al, Si, Ca, Ti, V, Cr, Fe, Co, Ni, Cu, Zn, Y, Zr, Nb and Mo, with $0.8 \leq x \leq 1.2$; $0 \leq y \leq 0.6$; $0 \leq z \leq 0.2$;

a compound ii) of formula $Li_xM_{2-x-y-z-w}M'_yM''_zM'''_wO_2$ (LMO2), where M, M', M'' and M''' are selected from the group consisting of B, Mg, Al, Si, Ca, Ti, V, Cr, Mn, Fe, Co, Ni, Cu, Zn, Y, Zr, Nb, W and Mo, provided that M or M' or M'' or M''' is selected from Mn, Co, Ni, or Fe; M, M', M'' and M''' being different from each other; with $0.8 \leq x \leq 1.4$; $0 \leq y \leq 0.5$; $0 \leq z \leq 0.5$; $0 \leq w \leq 0.2$ and $x+y+z+w<2.2$;

a compound iii) of formula $Li_xMn_{2-y-z}M'_yM''_zO_4$ (LMO), where M' and M'' are selected from the group consisting of B, Mg, Al, Si, Ca, Ti, V, Cr, Fe, Co, Ni, Cu, Zn, Y, Zr, Nb and Mo;

M' and M'' being different from each other, and $1 \leq x \leq 1.4$; $0 \leq y \leq 0.6$; $0 \leq z \leq 0.2$;

a compound iv) of formula $Li_xFe_{1-y}M_yPO_4$, where M is selected from the group consisting of B, Mg, Al, Si, Ca, Ti, V, Cr, Mn, Co, Ni, Cu, Zn, Y, Zr, Nb and Mo; and $0.8 \leq x \leq 1.2$; $0 \leq y \leq 0.6$;

a compound v) of formula $xLi_2MnO_3$; $(1-x)LiMO_2$ where M is selected from Ni, Co and Mn and $x \leq 1$, or a mixture of compounds i) to v).

An example of compound i) is $LiMn_{1-y}Fe_yPO_4$. A preferred example is $LiMnPO_4$.

The compound ii) may have the formula $Li_xM_{2-x-y-z-w}M'_yM''_zM'''_wO_2$, where $1 \leq x \leq 1.15$; M denotes Ni; M' denotes Mn; M'' denotes Co and M''' is selected from the group consisting of B, Mg, Al, Si, Ca, Ti, V, Cr, Fe, Cu, Zn, Y, Zr, Nb, Mo or a mixture thereof; $2-x-y-z-w>0$; $y>0$; $z>0$; $w \geq 0$.

The compound ii) may have the formula $LiNi_{1/3}Mn_{1/3}Co_{1/3}O_2$.

The compound ii) may also have the formula $Li_xM_{2-x-y-z-w}M'_yM''_zM'''_wO_2$, where $1 \leq x \leq 1.15$; M denotes Ni; M' denotes Co; M'' denotes Al and M''' is selected from the group consisting of B, Mg, Si, Ca, Ti, V, Cr, Fe, Cu, Zn, Y, Zr, Nb, Mo or a mixture thereof; $2-x-y-z-w>0$; $y>0$; $z>0$; $w \geq 0$. Preferably, $x=1$; $0.6 \leq 2-x-y-z \leq 0.85$; $0.10 \leq y \leq 0.25$; $0.05 \leq z \leq 0.15$ and $w \geq 0$.

The compound ii) may also be selected from $LiNiO_2$, $LiCoO_2$, $LiMnO_2$, Ni, Co and Mn which may be substituted by one or more of the cells selected from the group consisting of Mg, Mn (except for $LiMnO_2$), Al, B, Ti, V, Si, Cr, Fe, Cu, Zn, Zr.

An example of compound iii) is $LiMn_2O_4$.
An example of compound iv) is $LiFePO_4$.
An example of compound v) is $Li_2MnO_3$.

The cathodic active material may be at least partially covered by a carbon layer.

The binder may be selected from carboxymethylcellulose (CMC), styrene-butadiene copolymer (SBR), polytetrafluoroethylene (PTFE), polyamideimide (PAI), polyimide (PI), styrene-butadiene rubber (SBR), poly(acrylic acid) (PAA), polyvinyl alcohol, polyvinylidene fluoride (PVDF) and a mixture thereof.

The electronically conductive compound is usually carbon black.

A typical composition of active material deposited on the metal foil may be as follows:
from 75 to 90% by mass of cathodic active material, preferably from 80 to 90%
from 5 to 15% by mass of binder(s), preferably 10%;
from 5 to 10% by mass of carbon black, preferably 10%.

c) Manufacture of the Anode:

An anodic active material is mixed with one or more of the binders, such as those mentioned above, a solvent and generally one or more compounds with high electrical conduction properties, such as carbon black. The result is an active material composition which is deposited on one or both sides of a current collector. The current collector coated with the active material composition is laminated to adjust its thickness. An anode is thus obtained.

The active material composition deposited on the anode current collector may be the following:
from 75 to 90% anodic active material, preferably from 80 to 85%;
from 5 to 15% binder(s), preferably 10%;
from 5 to 10% carbon, preferably 7.5%.

The anodic active material may be selected from the group consisting of:
i) a carbon-based compound, such as graphite;
ii) a lithium oxide of titanium, such as $Li_4Ti_5O_{12}$;
iii) a metal selected from lithium, aluminum, silicon, tin, preferably silicon, and alloys containing these metals, preferably a lithium alloy.

d) Manufacture of the Cell:

An electrochemical assembly is formed by interposing a separator between an anode and a cathode. The electrochemical assembly is inserted into the cell container. The cell container can be of parallelepipedal or cylindrical format. In the case of a cylindrical cell, the electrochemical assembly is wound into a spiral and inserted into a cylindrical container. The container provided with the electrochemical assembly is filled with an electrolyte comprising at least one organic solvent and at least one lithium salt.

The electrochemical cell can be used as a source of electrical energy for hybrid or electric vehicles. It can also be used in other areas, such as powering telecommunication devices, emergency lighting, railways, aviation, powering portable electrical or electronic devices.

EXAMPLES

Different aluminum foils 1 to 9 were coated with a layer of a material comprising the cells Ti, C, H and optionally O. During the sputtering step, the foil, which serves as a substrate, was mounted on a barrel-shaped part, which was rotated, thus allowing a homogeneous deposition of the layer. The distance between the foil and the target was about 100 mm. The foil was polarized in pulse mode at a frequency of 250 kHz. The power applied to the titanium target was 6 kW. The argon flow rate was 30 cm$^3$/min at standard temperature and pressure conditions. The acetylene flow rate was regulated by detecting the light emission from the plasma in order to obtain the desired composition. An additional plasma source was powered by a 430 W power source for ion-assisted deposition growth.

The different layers of the aluminum foils were produced by varying the following parameters: the acetylene $C_2H_2$ flow rate, the bias voltage of the aluminum substrate, and the layer deposition rate. The composition of the different layers as well as the operating conditions for their manufacture are shown in Table 1. The thickness of the different layers and their resistivity are shown in Table 2.

TABLE 1

| Foil number | $C_2H_2$ flow rate (sccm) | Substrate bias voltage (V) | Deposition rate (nm/min) | Atomic percentages determined by RBS, ERDA and NRA | | | |
|---|---|---|---|---|---|---|---|
| | | | | Ti | C | H | O |
| 1* | 5 | 0 | 11.0 | 75.2 | 16.90 | 6.40 | 1.50 |
| 2* | 5 | −200 | 9.0 | 65.1 | 31.10 | 1.00 | 2.80 |
| 3* | 10 | 0 | 11.0 | 54.4 | 33.80 | 12.80 | <1% |
| 4 | 10 | −200 | 9.5 | 48.6 | 45.60 | 3.70 | 2.10 |

TABLE 1-continued

| Foil number | C₂H₂ flow rate (sccm) | Substrate bias voltage (V) | Deposition rate (nm/min) | Atomic percentages determined by RBS, ERDA and NRA | | | |
|---|---|---|---|---|---|---|---|
| | | | | Ti | C | H | O |
| 5 | 12.5 | −200 | 4.0 | 42.9 | 51.50 | 5.60 | <1% |
| 6 | 12.5 | −200 | 5.0 | 42.9 | 51.50 | 5.60 | <1% |
| 7* | 12.5 | 0 | 8.5 | 27 | 42.20 | 16.00 | 14.80 |
| 8 | 20 | −200 | 3.5 | 15.8 | 66.70 | 13.80 | 3.70 |
| 9* | 20 | 0 | 1.8 | 0 | 69.90 | 26.10 | 4.00 |

*example not being part of the invention

TABLE 2

| Foil number | Thickness (nm) | Resistivity (μΩ · m) |
|---|---|---|
| 1 | 110 | 2.5 |
| 2 | 90 | 1.9 |
| 3 | 110 | 8.8 |
| 4 | 95 | 2.7 |
| 5 | 55 | 2.2 |
| 6 | 100 | 2.4 |
| 7 | 170 | 21 |
| 8 | 140 | 20 |
| 9 | 35 | 27 |

Figure 1:
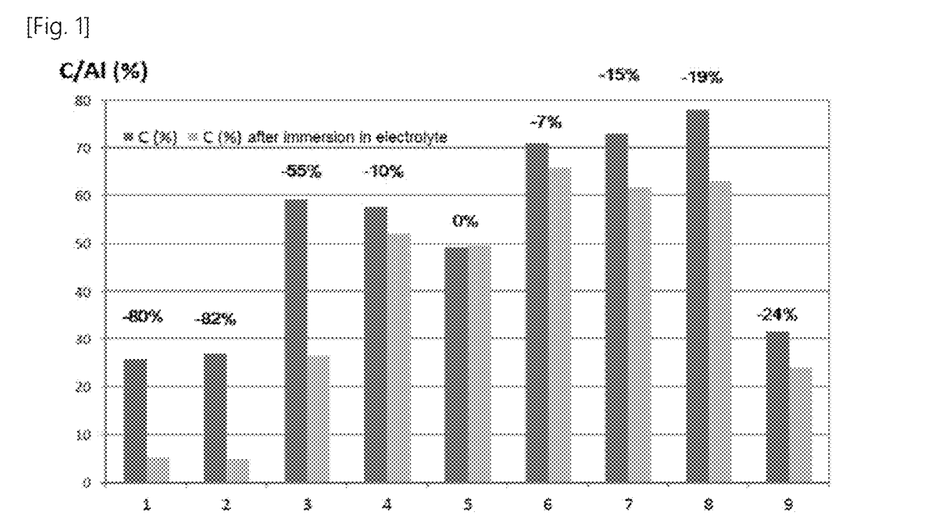
FIG. 1 shows for each of the foils 1 to 9, the carbon loss in the layer after immersion of the foil in an organic electrolyte maintained at 60° C. for three weeks.
Figure 2:
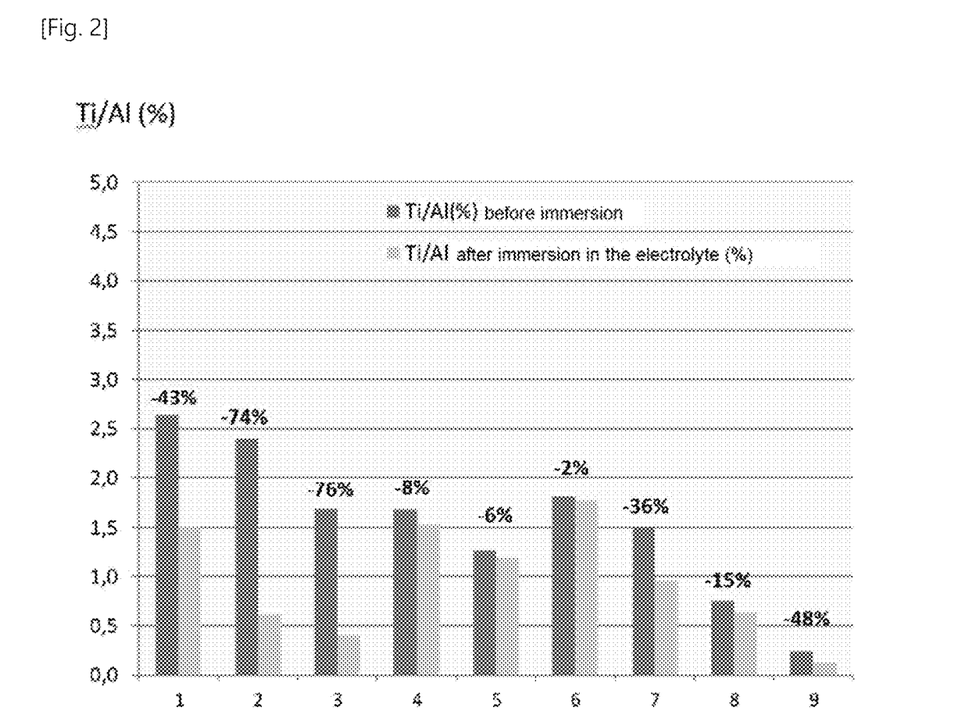
FIG. 2 indicates for each of the foils 1 to 9, the loss of titanium in the layer after immersion of the foil in an organic electrolyte maintained at 60° C. for three weeks.

A) Test of the Stability of the Foils in Contact with the Electrolyte at 60° C.:

Foils 1 to 9 were immersed in a carbonate-based electrolyte at 60° C. for 3 weeks and then analyzed by X-ray fluorescence after immersion. The losses of carbon, titanium and oxygen due to progressive dissolution of the layer in contact with the electrolyte were measured. The loss of carbon and titanium is evaluated by comparing the mass percentages C/Al and Ti/Al before and after immersion. The values of carbon and titanium losses are shown in FIGS. 1 and 2 respectively.

The results of this test show that:
the carbon loss is less than 20% for foils 4, 5, 6 and 8,
the carbon loss is at least 24% for foils 1, 2, 3 and 9.
the titanium loss is less than or equal to 15% for foils 4, 5, 6 and 8
the titanium loss is at least 43% for foils 1, 2, 3 and 9.

The surface of foil 7 shows a color change after immersion in the electrolyte. This change in color could reflect a change in the surface of the material layer that could be explained by a high atomic percentage of oxygen (14.80%). In addition, it can be noted that the material layer of foil 7 loses a notable amount of titanium (36%).

Foils 4, 5, 6 and 8 are therefore the foils with the best stability against the electrolyte. In particular, foils 4, 5 and 6 have a loss of carbon or titanium not exceeding 10%.

b) Evaluation in 18650-Size Lithium-Ion Cells

Different foils were used in the manufacture of cathodes of 18650-size lithium-ion cells. Table 3 summarizes the characteristics of the foils used in the different cells tested.

TABLE 3

| Series | Cell | Cathode foil | Substrate (foil) bias voltage |
|---|---|---|---|
| 1 | A | Bare aluminum foil | — |
|   | B | | |
| 2 | C | Foil according to the invention comprising on both sides a layer of a material comprising Ti, C, H and O | −300 V |
|   | D | | |
| 3 | E | Foil according to the invention comprising on both sides a layer of a material comprising Ti, C, H and O | −500 V |
|   | F | | |
| 4 | G | Reference foil comprising on both sides a carbon layer 1.9 μm thick | — |
|   | H | | |
|   | I | | |

The active material composition deposited on each of the cathode foils of cells A to I included an active material consisting of a lithium iron phosphate of the formula $LiFePO_4$, an electrical percolant based on carbon black, a binder based on polyvinylidene fluoride (PVdF). The density of the active material composition deposited on the foil, i.e., the electrode weight was 10.5 mg/cm²/side.

The anode consisted of a mixture of graphite, binder and thickeners coated on a current collector which was a copper foil. The different electrochemical assemblies were formed by interposing a separator between the cathode and the anode. Each assembly was coiled and introduced into the cell container. Each container was filled with organic electrolyte.

The electrical performance of the cells C to F of series 2 and 3 according to the invention was compared with that of cells with both sides of the cathode foil bare (cells A and B of series 1) and to that of cells with both sides of the cathode foil covered with a 1.9 μm layer of carbon (cells G to I of series 4).

B-1) Measurement of Internal Resistance:

The internal resistance of each cell was measured. This measurement was carried out using a reference cycle consisting of a charge and then a discharge at regime C/5, where C is the nominal capacity of the cell. During the discharge, several discharge pulses of 10 seconds each at regimes between 2 C and 10 C were carried out for a cell state of charge of about 50%. These pulses made it possible to calculate the internal resistance Ri by applying the formula:

$$Ri=(U_{C/5}-U_{regime})/I_{regime} \quad \text{[Math 1]}$$

where
$U_{C/5}$ denotes the voltage of the discharge cell at regime C/5 before the application of the discharge pulse.
$U_{regime}$ denotes the cell voltage after 10 seconds of application of the discharge pulse at the discharge regime $I_{regime}$ The internal resistance is then multiplied by the area of cathode coated on the foil to obtain a resistance expressed in Ω×cm².

Figure 3:
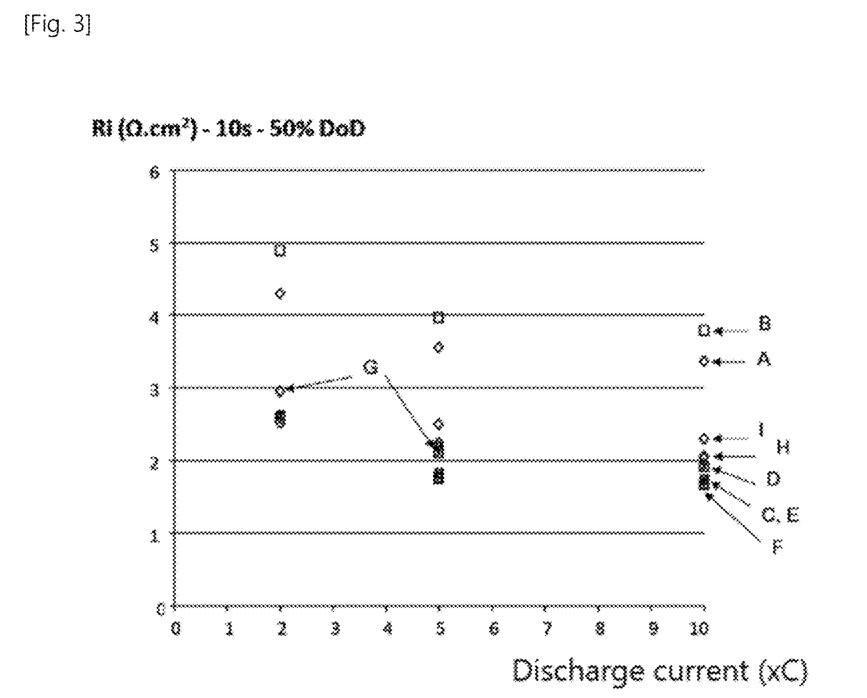
FIG. 3 represents the value of the internal resistance of the cells A to I measured for different discharge regimes from 2 C to 10 C for a depth of discharge of about 50%.

FIG. 3 shows the internal resistance values of cells A to I of series 1 to 4 for different discharge regimes from 2 C to 10 C. It can be seen that the cells with the highest internal resistance are cells A and B whose cathode has a bare foil.

The presence of a layer comprising the material according to the invention or of a carbon layer on the cathode foil induces a decrease in the internal resistance of the cell. Cells G, H and I whose cathode comprises a carbon-coated foil have an internal resistance about 40% lower than that of cells A and B. Cells C, D, E and F according to the invention have an even lower internal resistance than cells G, H and I.

Figure 4:
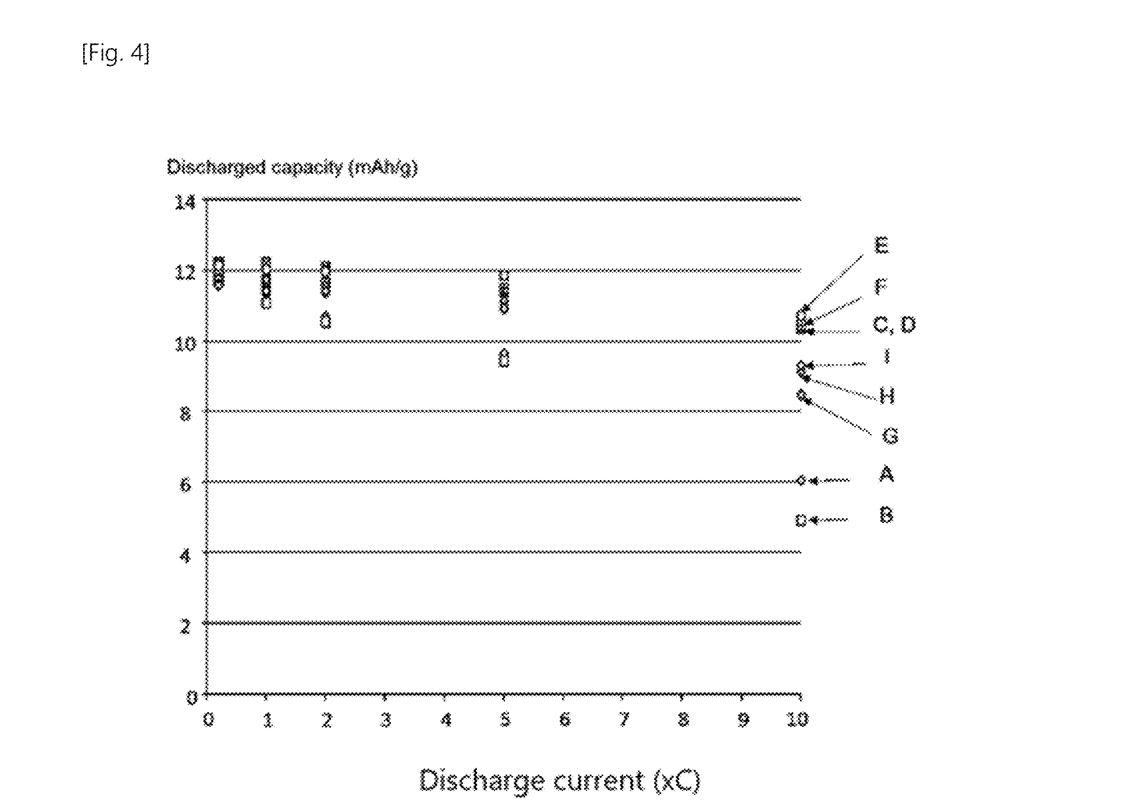
FIG. 4 represents the value of the discharge capacity of the cells A to I measured for different discharge regimes from C/5 to 10 C.

B-2) Measurement of Cell Capacity for Different Discharge Regimes:

Cells A to I were subjected to an electrical test to evaluate their capacity. This test involves a charging of the cells at regime C/5 followed by a discharge at a regime between C/5 to 10 C. The discharged capacities in mAh per gram of $LiFePO_4$ active material for each discharge regime are shown in FIG. 4. It can be seen that cells A and B whose cathode comprises a bare foil have the lowest capacity. A marked improvement in the discharged capacitance is observed when the cathode foil is covered either with a layer of carbon or with a layer comprising the material according to the invention. This improvement is due to the fact that the presence of a layer on the surface of the cathode foil reduces the contact resistance with the active material. A layer comprising the material according to the invention reduces the polarization of the electrode to a greater extent than a carbon-based layer. FIG. 4 shows the improved capacitance of cells with a conductive layer on the cathode foil compared with an cell with a bare cathode foil:

- at discharge regime 2 C: the increase in capacity is 10% for foils coated with the material according to the invention and 9.4% for foils coated with carbon.
- at discharge regime 5 C: the increase in capacity is 19% for foils coated with the material according to the invention and 16% for foils coated with carbon.
- at discharge regime 10 C: the increase in capacity is 72% for foils coated with the material according to the invention and 51% for foils coated with carbon.

The benefit of the presence of the layer of material according to the invention is therefore more apparent at a high discharge regime than at a low regime.

Figure 5:
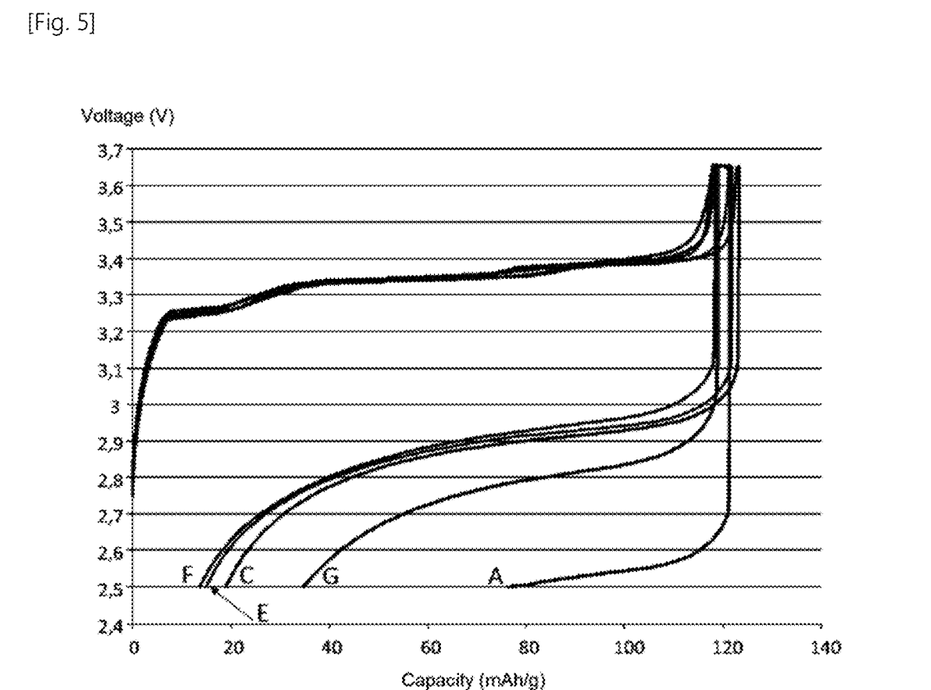
FIG. 5 shows the charging curve at regime C/5 and the discharge curve at regime 10 C of the cells A, C, E, F and G.

B-3) Measuring the Polarization of the Cells:

The charging curve at regime C/5 and discharge curve at regime 10 C of the cells A, C, E, F and G were plotted. The bias of the cell, which is the voltage difference between the charge and discharge voltage for a given state of charge of the cell, can thus be evaluated. It can be seen that the cells C, E, F and G, whose cathode foil has a carbon layer or a layer of the material according to the invention, have a weaker polarization than the cell A whose cathode foil is bare. The cells C, E and F whose cathode comprises a foil coated with the material according to the invention have a lower polarization than the cell G whose cathode comprises a carbon-coated foil.

Figure 6:
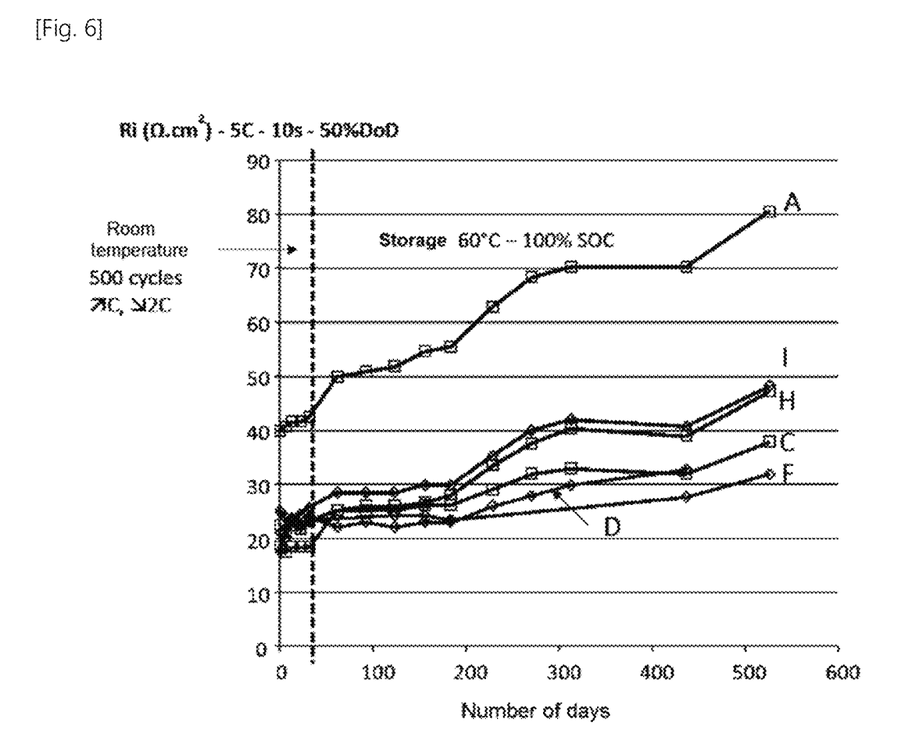
FIG. 6 represents the change in internal resistance of the cells A, C, D, F, H and I during an aging test consisting of 500 charge/discharge cycles at room temperature (C charge, 2 C discharge) followed by storage of the cells at 60° C. in a 100% state of charge. The internal resistance is measured by applying a discharge pulse at regime 5 C for 10 seconds, for a depth of discharge of about 50%.

B-4) Study of the Aging of the Cells:

The cells A, C, D, F, H and I then underwent an aging test consisting of 500 charge/discharge cycles at room temperature (C charge, 2 C discharge) followed by storage at 60° C. at 100% state of charge. The internal resistance was measured periodically during the 500 charge/discharge cycles as well as during storage at 60° C., according to the measurement conditions described in paragraph B-1, for a discharge pulse at regime 5 C. The change in the internal resistance of the cells during the aging test is shown in FIG. 6. It can be seen that:

- at the start of the test, the internal resistance of cell A with the bare cathode foil is the highest ($40\Omega \times cm^2$). The internal resistance of cells H and I whose cathode foil is coated with carbon is about 22 to $25\Omega \times cm^2$. Cells C, D and F whose cathode foil is coated with the material according to the invention have an internal resistance of about $20\Omega \times cm^2$, which is lower than that of cells H and I.
- the internal resistance of cells C, D and F according to the invention increases less rapidly during the test than that of cells A, H and I and remains lower at the end of the test than that of cell A at the beginning of the test.

The layer according to the invention is therefore resistant to aging, both when the cell is used under cycling conditions and under high-temperature storage conditions.

The invention claimed is:

1. A process for manufacturing a layer of a material comprising a metal or a metal alloy, carbon and hydrogen on a metal foil, said process comprising the steps of:
    a) provision of a substrate consisting of a metal foil,
    b) etching of one side of the substrate by bombardment of ions resulting from the ionization of an inert gas,
    c) sputter deposition on the etched side of the substrate of a material comprising:
        a metal or a metal alloy,
        carbon,
        hydrogen,
        and optionally oxygen,
    the sputtering being carried out with a single target consisting of said metal or of said metal alloy, said metal alloy being devoid of carbon, the sputtering comprising a step of injecting into a chamber a mixture of an inert gas and a hydrocarbon gas at a temperature of 20° C. to 30° C., this mixture optionally containing nitrogen,
    wherein carbon and hydrogen in the material deposited in step c) originate from the hydrocarbon gas.

2. The process as claimed in claim 1, wherein the metal of the material of step c) is titanium.

3. The process as claimed in claim 1, wherein the hydrocarbon is acetylene.

4. The process according to claim 1, devoid of any annealing step.

5. The process according to claim 1, wherein:
    the atomic percentage of the metal or of the metals of the alloy in the material ranges from 10 to 60%,
    the atomic percentage of carbon in the material ranges from 35 to 70%,
    the atomic percentage of hydrogen in the material ranges from 2 to 20%,
    the atomic percentage of oxygen if present in the material being less than or equal to 10%.

* * * * *